US010658498B2

(12) United States Patent
Hirabayashi (10) Patent No.: US 10,658,498 B2
(45) Date of Patent: May 19, 2020

(54) SEMICONDUCTOR DEVICE INCLUDING DIODE STRUCTURE

(71) Applicant: DENSO CORPORATION, Kariya-shi (JP)

(72) Inventor: Yasuhiro Hirabayashi, Tajimi (JP)

(73) Assignee: DENSO CORPORATION, Kariya-shi (JP)

( * ) Notice: Subject to any disclaimer, the term of this patent is extended or adjusted under 35 U.S.C. 154(b) by 0 days.

(21) Appl. No.: 16/160,104

(22) Filed: Oct. 15, 2018

(65) Prior Publication Data

US 2019/0115460 A1   Apr. 18, 2019

(30) Foreign Application Priority Data

Oct. 18, 2017 (JP) .................................. 2017-201922

(51) Int. Cl.
*H01L 29/739* (2006.01)
*H01L 27/07* (2006.01)
(Continued)

(52) U.S. Cl.
CPC ...... *H01L 29/7397* (2013.01); *H01L 27/0716* (2013.01); *H01L 27/0727* (2013.01); *H01L 29/0603* (2013.01); *H01L 29/083* (2013.01); *H01L 29/0804* (2013.01); *H01L 29/0821* (2013.01); *H01L 29/0834* (2013.01); *H01L 29/1095* (2013.01); *H01L 29/407* (2013.01); *H01L 29/41708* (2013.01);
(Continued)

(58) Field of Classification Search
CPC ............. H01L 27/0629; H01L 27/0635; H01L 27/0664; H01L 27/0716; H01L 27/0727; H01L 27/0761; H01L 27/0766; H01L 29/7397

See application file for complete search history.

(56) References Cited

U.S. PATENT DOCUMENTS

2016/0141402 A1\* 5/2016 Hosokawa .......... H01L 29/0834
257/144
2016/0233130 A1\* 8/2016 Onishi ................ H01L 21/8222
(Continued)

FOREIGN PATENT DOCUMENTS

JP           2016162897 A      9/2016

*Primary Examiner* — Jaehwan Oh
*Assistant Examiner* — Molly K Reida
(74) *Attorney, Agent, or Firm* — Hunton Andrews Kurth LLP (57) ABSTRACT

A semiconductor device may include a semiconductor substrate, an upper electrode and a lower electrode. The semiconductor substrate may include: a p-type anode region being in contact with the upper electrode; an n-type cathode region being in contact with the lower electrode; an n-type drift region interposed between the anode region and the cathode region. The semiconductor substrate may further include a barrier region interposed between the anode region and the drift region; and an n-type pillar region extending between the barrier region and the upper electrode. The barrier region may include a multi-layer structure in which a p-type second barrier layer is interposed between an n-type first barrier layer and an n-type third barrier layer. The first barrier layer may be in contact with the anode region and is connected to the upper electrode via the pillar region.

6 Claims, 6 Drawing Sheets

(51) Int. Cl.
*H01L 29/861* (2006.01)
*H01L 29/10* (2006.01)
*H01L 29/08* (2006.01)
*H01L 29/417* (2006.01)
*H01L 29/423* (2006.01)
*H01L 29/06* (2006.01)
*H01L 29/40* (2006.01)
*H01L 29/16* (2006.01)

(52) U.S. Cl.
CPC ........ H01L 29/4236 (2013.01); H01L 29/861 (2013.01); H01L 29/1608 (2013.01)

(56) References Cited

U.S. PATENT DOCUMENTS

2016/0260710 A1\* 9/2016 Okawara ............. H01L 29/7397
2016/0359027 A1\* 12/2016 Soeno ................. H01L 29/7397

\* cited by examiner

SEMICONDUCTOR DEVICE INCLUDING DIODE STRUCTURE

CROSS-REFERENCE

This application claims priority to Japanese patent application No. 2017-201922, filed on Oct. 18, 2017, the entire contents of which are incorporated herein by reference.

TECHNICAL FIELD

A technique disclosed herein relates to a semiconductor device, especially to a semiconductor device including a diode structure.

BACKGROUND

Japanese Patent Application Publication No. 2016-162897 describes a semiconductor device including a diode structure. This semiconductor device includes a semiconductor substrate, an upper electrode provided on an upper surface of the semiconductor substrate, and a lower electrode provided on a lower surface of the semiconductor substrate located opposite to the upper surface. The semiconductor substrate includes a p-type anode region being in contact with the upper electrode, an n-type cathode region being in contact with the lower electrode, and an n-type drift region having a carrier density lower than a carrier density of the cathode region and interposed between the anode region and the cathode region.

This semiconductor device further includes an n-type barrier region interposed between the anode region and the drift region, and an n-type pillar region being in Schottky contact with the upper electrode and extending between the barrier region and the upper electrode. A carrier density of the barrier region is higher than the carrier density of the drift region. According to this configuration, since injection of holes from the anode region to the drift region is suppressed at forward bias, a recovery current occurring upon switching to reverse bias can be reduced.

Meanwhile, the presence of the aforementioned barrier region and pillar region may be a factor causing a snapback phenomenon in which an increase in a forward current temporarily delays relative to an increase in a forward voltage upon switching to the forward bias. In order to suppress the snapback phenomenon, the barrier region may have a low carrier density. However, when the carrier density of the barrier region is low, the aforementioned effect of suppressing the hole injection is reduced. In this regard, in the semiconductor device of Japanese Patent Application Publication No. 2016-162897, the carrier density of the barrier region is varied along a lateral direction of the semiconductor substrate (i.e., a direction parallel with the semiconductor substrate). According to this configuration, the barrier region can suppress the hole injection by its portion having a high carrier density and can also suppress the snapback phenomenon from occurring by its portion having a low carrier density.

SUMMARY

As aforementioned, in a semiconductor device including a diode structure, a provision of a barrier region can reduce a recovery current. On the other hand, the provision of the barrier region may be a factor causing the problem of snapback phenomenon. The disclosure herein provides a novel technique capable of reducing a recovery current and capable of suppressing the snapback phenomenon.

The technique disclosed herein is embodied as a semiconductor device. The semiconductor device may comprise: a semiconductor substrate; an upper electrode provided on an upper surface of the semiconductor substrate; and a lower electrode provided on a lower surface of the semiconductor substrate located opposite to the upper surface, wherein the semiconductor substrate may comprise: a p-type anode region being in contact with the upper electrode; an n-type cathode region being in contact with the lower electrode; an n-type drift region interposed between the anode region and the cathode region, a carrier density of the drift region being lower than a carrier density of the cathode region, a barrier region interposed between the anode region and the drift region; and an n-type pillar region extending between the barrier region and the upper electrode, the pillar region being in Schottky contact with the upper electrode, the barrier region may comprise an n-type first barrier layer, a p-type second barrier layer and an n-type third barrier layer, wherein the second barrier layer may be interposed between the first barrier layer and the third barrier layer, carrier densities of the first and third barrier layers may be each higher than the carrier density of the drift region, and the first barrier layer may be in contact with the anode region and may be connected to the upper electrode via the pillar region.

The semiconductor device above includes a diode structure in the semiconductor substrate. This diode allows a current flowing from the upper electrode to the lower electrode and prohibits a current flowing from the lower electrode to the upper electrode. The barrier region is provided between the anode region and the drift region. The barrier region includes a multi-layer structure in which the p-type second barrier layer is interposed between the n-type first and third barrier layers. The n-type first and third barrier layers suppress injection of holes from the anode region to the drift region at forward bias. Due to this, a recovery current occurring upon switching to reverse bias can be reduced. In addition, the p-type second barrier layer can suppress electrons from flowing to the upper electrode from the drift region through the pillar region upon switching to the forward bias. Due to this, electrons injected to the anode region increase, and thus the snapback phenomenon can be suppressed from occurring.

The n-type first and third barrier layers are separated from each other by the p-type second barrier layer. Thus, the first barrier layer and the third barrier layer may have different carrier densities. As an example, the first barrier layer connected to the pillar region may have a relatively low carrier density. Due to this, electrons are suppressed from flowing to the upper electrode from the drift region through the pillar region upon switching to the forward bias, and thus the snapback phenomenon is further suppressed. Contrary to this, the third barrier layer may have a relatively high carrier density. Due to this, the function of the barrier region, which is the reduction in recovery current, can be enhanced. Since the third barrier layer is separated from the pillar region by the second barrier layer, the snapback phenomenon is not encouraged to occur even when the third barrier layer has a high carrier density.

In one embodiment of the disclosure herein, the semiconductor substrate may further comprise: a p-type body region being in contact with the upper electrode; an n-type emitter region being in contact with the upper electrode and being separated from the drift region by the body region; a trench provided in the upper surface and extending up to the drift region; and a p-type collector region being in contact with the lower electrode and being separated from the body region by the drift region. A gate electrode and a gate insulator film may be provided within the trench, the gate electrode may be opposed to the emitter region, the body region and the drift region via the gate insulator film, and the barrier region may be interposed between the body region and the drift region. According to such a configuration, the semiconductor substrate further includes an IGBT (Insulated Gate Bipolar Transistor) structure. That is, the semiconductor device may include an RC (Reverse Conducting)-IGBT structure which is provided with both a diode structure and an IGBT structure.

In the semiconductor device above, a current may flow from the lower electrode to the upper electrode when a predetermined drive voltage is applied to the gate electrode and the IGBT is turned on. In the semiconductor substrate, electrons are injected to the drift region from the emitter region, holes are injected to the drift region from the collector region, and conductivity modulation occurs in the drift region. In this case, since the n-type third barrier layer having the relatively high carrier density is located adjacent to the drift region, a large number of holes are likely to be accumulated in the drift region. Thus, the conductivity modulation in the drift region is promoted, and an on-resistance of the IGBT is reduced. As such, the third barrier layer of the barrier region can contribute to the improvement of on-resistance in the IGBT as well as the improvement of recovery property in the diode.

BRIEF DESCRIPTION OF DRAWINGS

FIG. 4 shows an IGBT region 12Y in the semiconductor device 10 of the first embodiment at turn-on.

DETAILED DESCRIPTION

In one embodiment of the disclosure herein, in a case where the semiconductor substrate includes the aforementioned IGBT structure, the barrier region may further comprise a p-type forth barrier layer interposed between the third barrier layer and the drift region. According to such a configuration, an area where the gate electrode is opposed to the drift region via the gate insulator film can be reduced. Due to this, parasitic capacitance between the gate electrode and the lower electrode is reduced, and thus the IGBT can be turned off (i.e., the gate electrode can discharge) in a short period of time.

In one embodiment of the disclosure herein, the carrier density of the third barrier layer may be higher than the carrier density of the first barrier layer. According to such a configuration, when the semiconductor device functions as the diode, the recovery current can be reduced while the snapback phenomenon is suppressed from occurring. In addition, when the semiconductor device functions as the IGBT, conductivity modulation in the drift region is promoted by the third barrier layer having the high carrier density, and the on-resistance of the IGBT is reduced. As an example, the carrier density of the third barrier layer may be at least three times as high as the carrier density of the first barrier layer.

In one embodiment of the disclosure herein, the carrier density of the third barrier layer may be constant along a direction parallel with the semiconductor substrate. According to such a configuration, an electrical property of the semiconductor substrate can be made to be constant. Especially when the semiconductor device functions as the IGBT, the conductivity modulation in the drift region occurs evenly, and thus the on-resistance can be effectively reduced.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

A semiconductor device 10 of a first embodiment will be described with reference to the drawings. The semiconductor device 10 of the present embodiment belongs to power semiconductor devices and can be employed, for example, as a switching element of a converter and an inverter in an electric vehicle, although no limitation is applied thereto. The electric vehicle herein includes various types of vehicles of which wheels are driven by a motor, such as a hybrid vehicle, a fuel cell vehicle, a rechargeable electric vehicle, and the like.

Figure 1:
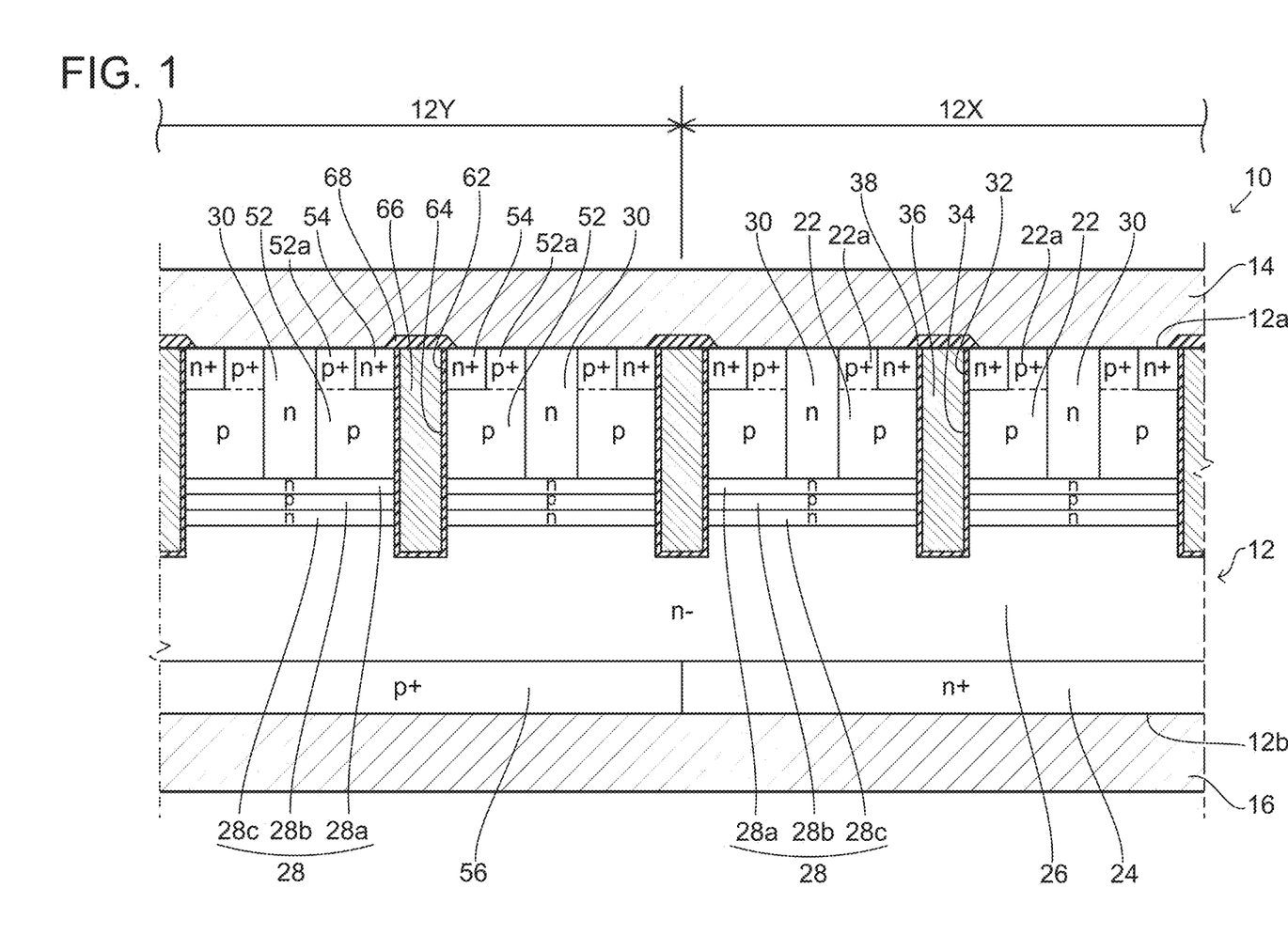
FIG. 1 is a cross sectional view schematically showing a configuration of a semiconductor device 10 of a first embodiment.

As shown in FIG. 1, the semiconductor device 10 comprises a semiconductor substrate 12, an upper electrode 14 provided on an upper surface 12a of the semiconductor substrate 12, and a lower electrode 16 provided on a lower surface 12b of the semiconductor substrate 12. The semiconductor substrate 12 is a silicon substrate constituted of silicon (Si). It should be noted that the semiconductor substrate 12 is not limited to the silicon substrate, and may be a silicon carbide (SiC) substrate or a substrate (crystalline body) constituted of other semiconductor material. Each of the upper electrode 14 and the lower electrode 16 is constituted of a conductive material. The materials constituting the upper electrode 14 and the lower electrode 16 are not particularly limited, and may be metallic materials such as aluminum (Al), nickel (Ni), titanium (Ti), gold (Au), and the like.

It should be noted that the upper surface 12a of the semiconductor substrate 12 means one surface of the semiconductor substrate 12, and the lower surface 12b of the semiconductor substrate 12 means another surface of the semiconductor substrate 12 which is located opposite to the upper surface 12a. In the disclosure herein, the expressions of "upper surface" and "lower surface" are used merely for distinguishing the two surfaces located opposed to each other for the sake of convenience, and do not place any limitation on orientations of the semiconductor device 10 during its manufacturing and during use.

The semiconductor substrate 12 includes a diode region 12X and an IGBT region 12Y. Each of the diode region 12X and the IGBT region 12Y extends from the upper surface 12a to the lower surface 12b of the semiconductor substrate 12. The diode region 12X and the IGBT region 12Y are adjacent to each other in a plan view of the semiconductor substrate 12. As is understood from what will be described later, the diode region 12X is provided with both of a pn-junction diode structure and a Schottky-junction diode structure, and the IGBT region 12Y is provided with an IGBT structure. That is, the semiconductor device 10 is a semiconductor device including both of the diode structure and the IGBT structure, and is generally called an RC-IGBT.

The diode region 12X comprises an anode region 22, a cathode region 24, a drift region 26, a barrier region 28, and pillar regions 30. The anode region 22 is a p-type semiconductor region and is in contact with the upper electrode 14. Portions 22a of the anode region 22 which are in contact with the upper electrode 14 have a higher carrier density (i.e., density of holes) than other portion of the anode region 22 and are in ohmic contact with the upper electrode 14. The cathode region 24 is an n-type semiconductor region and is in contact with the lower electrode 16. The cathode region 24 has a sufficiently high carrier density and is in ohmic contact with the lower electrode 16.

Similarly to the cathode region 24, the drift region 26 is an n-type semiconductor region. However, a carrier density (i.e., density of free electrons) of the drift region 26 is lower than the carrier density of the cathode region 24. The drift region 26 is interposed between the anode region 22 and the cathode region 24. That is, the anode region 22 and the cathode region 24 are separated from each other at least by the drift region 26. The drift region 26 expands not only in the diode region 12X but also in the IGBT region 12Y.

The barrier region 28 is interposed between the anode region 22 and the drift region 26. That is, the anode region 22 and the drift region 26 are separated from each other at least by the barrier region 28. The pillar regions 30 are n-type semiconductor regions. A carrier density of the pillar regions 30 is lower than the carrier density of the cathode region 24, and is substantially equal to or higher than the carrier density of the drift region 26. The pillar regions 30 extend between the barrier region 28 and the upper electrode 14, and are in Schottky contact with the upper electrode 14.

The barrier region 28 and the pillar regions 30 are provided not only in the diode region 12X but also in the IGBT region 12Y.

The barrier region 28 of the present embodiment comprises an n-type first barrier layer 28a, a p-type second barrier layer 28b, and an n-type third barrier layer 28c, and includes a multi-layer structure in which the second barrier layer 28b is interposed between the first barrier layer 28a and the third barrier layer 28c. Carrier densities of the first barrier layer 28a and the third barrier layer 28c are each higher than the carrier density of the drift region 26 and are each lower than the carrier density of the cathode region 24. The first barrier layer 28a is in contact with the anode region 22 and is connected to the upper electrode 14 via the pillar regions 30. The third barrier layer 28c is separated from the first barrier layer 28a and the pillar regions 30 by the second barrier layer 28b. In the barrier region 28 of the present embodiment, the carrier density of the third barrier layer 28c is higher than the carrier density of the first barrier layer 28a, although no limitation is placed thereon. A thickness of the barrier region 28 (a dimension thereof in an up-and-down direction in FIG. 1) is sufficiently thinner than each of a thickness of the anode region 22 and a thickness of the draft region 26.

The diode region 12X is further provided with trenches 32. The trenches 32 are provided in the upper surface 12a of the semiconductor substrate 12 and have a depth reaching the drift region 26. A trench insulating film 34 and a dummy electrode 36 are provided within each trench 32. Each dummy electrode 36 is separated from the semiconductor substrate 12 (i.e., inner surface of its corresponding trench 32) by its corresponding trench insulating film 34. Further, an interlayer insulating film 38 is provided between each dummy electrode 36 and the upper electrode 14. The dummy electrodes 36 are configured to be maintained at a potential same as that of the upper electrode 14. Each of the aforementioned pillar regions 30 is located between each pair of the trenches 32 adjacent to each other, and the anode region 22 is interposed between each of the trenches 32 and the pillar region 30. It should be noted that the trenches 32, the trench insulating films 34, the dummy electrodes 36, and the interlayer insulator films 38 are not necessarily required in the diode region 12X, and they may be omitted.

Next, the IGBT region 12Y will be described. The IGBT region 12Y comprises a body region 52, emitter regions 54, a collector region 56, the drift region 26, the barrier region 28, and the pillar regions 30. The body region 52 is a p-type semiconductor region and is in contact with the upper electrode 14. Portions 52a of the body region 52 which are in contact with the upper electrode 14 have a higher carrier density (i.e., density of holes) than other portion of the body region 52 and are in ohmic contact with the upper electrode 14. The barrier region 28 is interposed between the body region 52 and the drift region 26. That is, the body region 52 is separated from the drift region 26 by the barrier region 28. In the IGBT region 12Y as well, the pillar regions 30 extend between the barrier region 28 and the upper electrode 14, and are in Schottky contact with the upper electrode 14.

The emitter regions 54 are n-type semiconductor regions and are in contact with the upper electrode 14. The emitter regions 54 have a sufficiently high carrier density and are in ohmic contact with the upper electrode 14. The emitter regions 54 are separated from the drift region 26 and the pillar regions 30 by the body region 52. It should be noted that in the semiconductor device 10 of the present embodiment, n-type semiconductor regions similar to the emitter regions 54 are provided in the diode region 12X as well.

However, these n-type semiconductor regions in the diode region 12X are not necessarily required and may be omitted.

The collector region 56 is a p-type semiconductor region and is in contact with the lower electrode 16. The collector region 56 has a sufficiently high carrier density and is in ohmic contact with the lower electrode 16. The collector region 56 is separated from the body region 52 by the drift region 26 and the barrier region 28. As shown in FIG. 1, the n-type cathode region 24 is provided along the lower surface 12b of the semiconductor substrate 12 in the aforementioned diode region 12X, whereas the p-type collector region 56 is provided along the lower surface 12b of the semiconductor substrate 12 in the IGBT region 12Y. In this regard, the diode region 12X and the IGBT region 12Y are different from each other.

The IGBT region 12Y is provided with trenches 62. The trenches 62 are provided in the upper surface 12a of the semiconductor substrate 12 and have a depth reaching the drift region 26. A gate insulator film 64 and a gate electrode 66 are provided within each trench 62. Each gate electrode 66 is separated from the semiconductor substrate 12 (i.e., inner surface of its corresponding trench 62) by its corresponding gate insulator film 64. Further, an interlayer insulating film 68 is provided between each gate electrode 66 and the upper electrode 14. Each gate electrode 66 is opposed to the emitter regions 54, the body region 52, and the drift region 26 via its corresponding gate insulating film 64. The gate electrodes 66 are configured to allow an external driver circuit to apply a predetermined gate voltage thereto.

Figure 2:
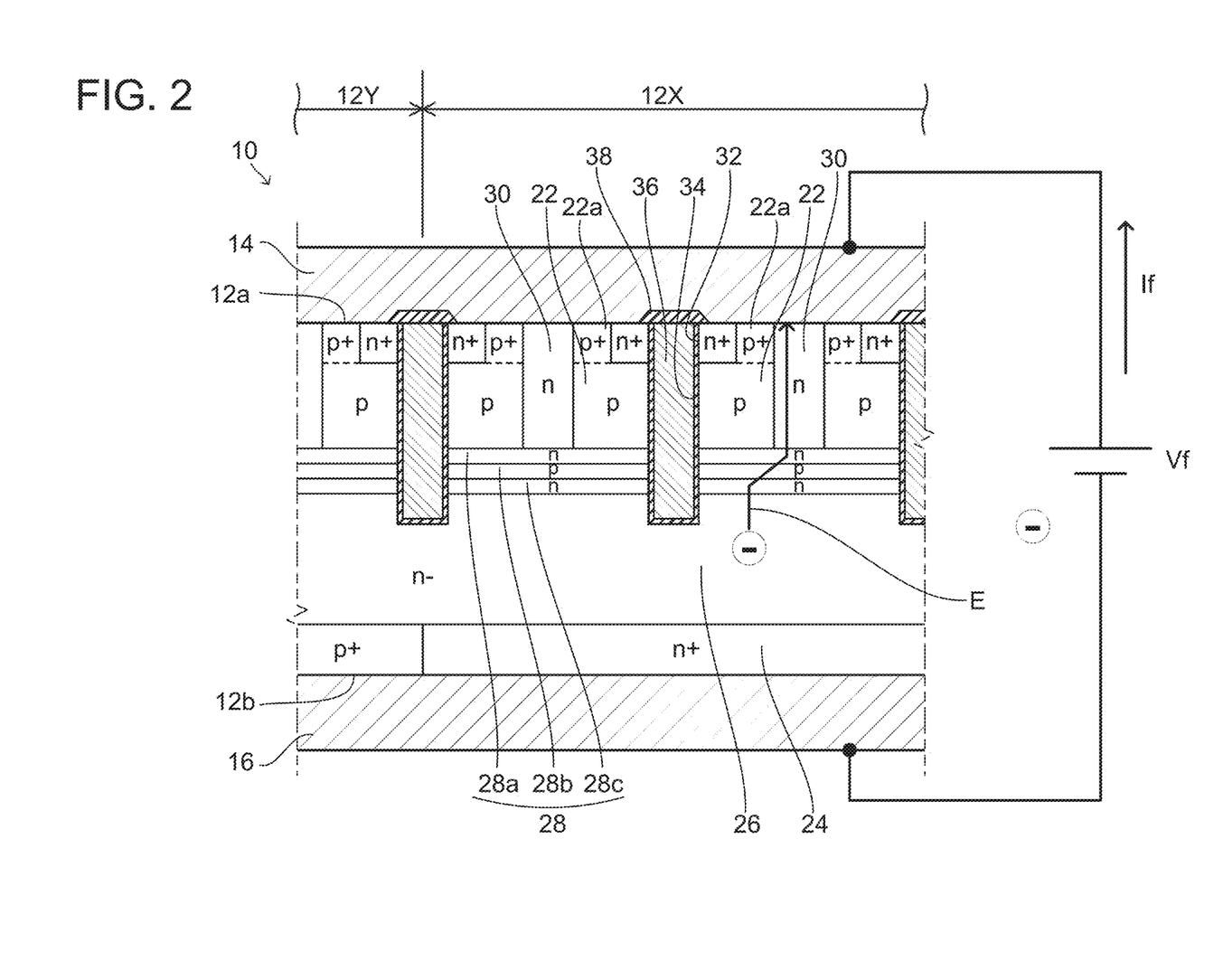
FIG. 2 shows a diode region 12X in the semiconductor device 10 of the first embodiment at forward bias.
Figure 3:
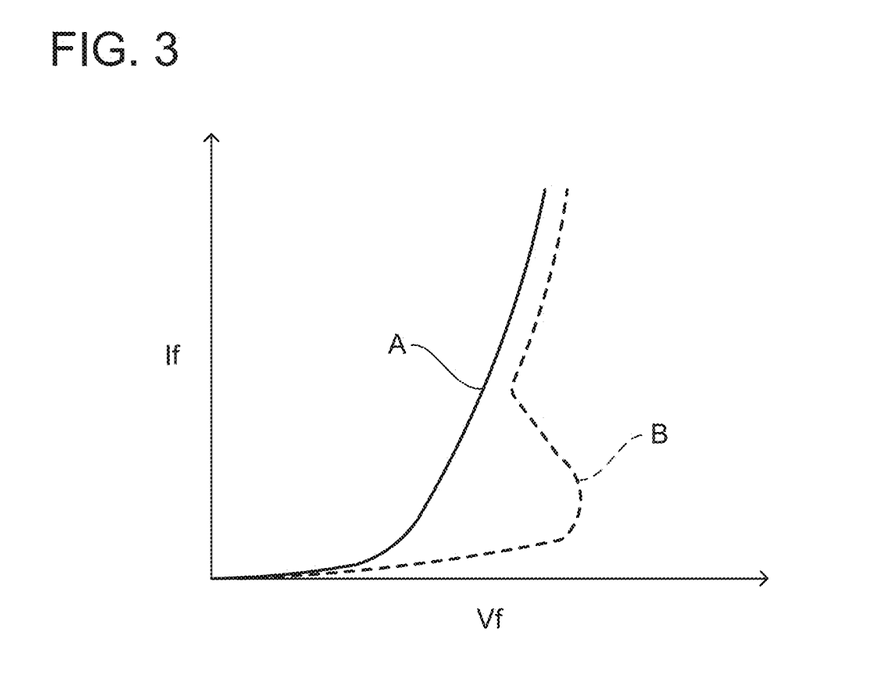
FIG. 3 schematically shows a relationship between a forward voltage Vf and a forward current If in the diode region 12X in the semiconductor device 10 of the first embodiment.

According to the aforementioned configuration, the semiconductor device 10 of the present embodiment can function as a diode in the diode region 12X. The diode region 12X allows a current flowing from the upper electrode 14 to the lower electrode 16 and prohibits a current flowing from the lower electrode 16 to the upper electrode 14. That is, as shown in FIG. 2, when a forward voltage Vf is applied between the upper electrode 14 and the lower electrode 16, a forward current If flows in the semiconductor device 10. FIG. 3 shows a graph A which schematically shows a relationship between the forward voltage Vf and the forward current If.

In the semiconductor device 10 of the present embodiment, the barrier region 28 is provided between the anode region 22 and the drift region 26. The barrier region 28 includes the multi-layer structure in which the p-type second barrier layer 28b is interposed between the n-type first and third barrier layers 28a and 28c. In a case of forward bias as shown in FIG. 2, the n-type first and third barrier layers 28a, 28c suppress injection of holes from the anode region 22 to the drift region 26. Due to this, a recovery current occurring upon switching to a reverse bias is reduced. In addition, upon switching to the forward bias, the p-type second barrier layer 28b can suppress electrons E from flowing to the upper electrode 14 from the drift region 26 through the pillar regions 30. Due to this, electrons injected to the anode region 22 increase, and thus a snapback phenomenon is suppressed from occurring. The snapback phenomenon is a phenomenon where an increase in the forward current If temporarily delays relative to an increase in the forward voltage Vf upon switching to the forward bias, as shown by a graph B in FIG. 3. The snapback phenomenon may cause an unnecessary loss, for example.

Further, the n-type first and third barrier layers 28a, 28c are separated from each other by the p-type second barrier layer 28b. Therefore, carrier densities may be differentiated between the first barrier layer 28a and the third barrier layer 28c. As aforementioned, in the barrier region 28 of the present embodiment, the carrier density of the third barrier layer 28c is higher than the carrier density of the first barrier layer 28a. When the first barrier layer 28a, which is connected to the pillar regions 30, has a lower carrier density, the electrons E are more suppressed from flowing to the upper electrode 14 from the drift region 26 through the pillar regions 30 upon switching to the forward bias, and the snapback phenomenon is more suppressed from occurring. Meanwhile, when the third barrier layer 28c has a higher carrier density, the function of reducing the recovery current that the barrier region 28 has can be enhanced. Since the third barrier layer 28c is separated from the pillar regions 30 by the second barrier layer 28b, the snapback phenomenon is not encouraged to occur even though the carrier density of the third barrier layer 28c is high. As such, in the diode region 12X, the barrier region 28 including the multi-layer structure can reduce the recovery current and suppress the snapback phenomenon from occurring as well.

Figure 4:
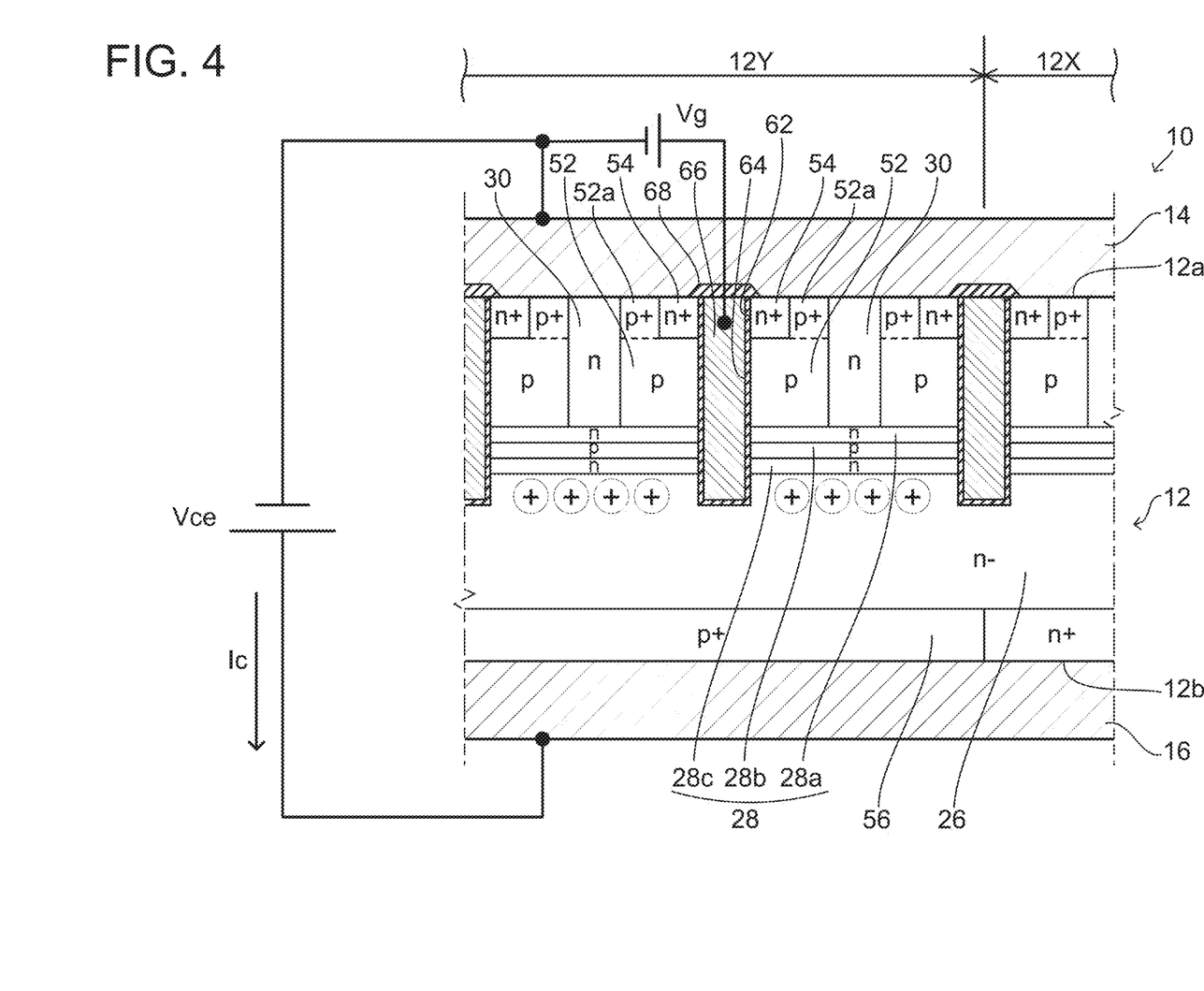

The semiconductor device 10 of the present embodiment can further function as an IGBT in the IGBT region 12Y. As shown in FIG. 4, when a predetermined gate voltage Vg is applied to the gate electrodes 66 and the IGBT is turned on, a current Ic may flow from the lower electrode 16 to the upper electrode 14. In the semiconductor substrate 12, electrons are injected to the drift region 26 from the emitter regions 54, holes are injected to the drift region 26 from the collector region 56, and a conductivity modulation occurs in the drift region 26. In this case, a large number of the holes are likely to be accumulated in the drift region 26 because the n-type third barrier layer 28c having the relatively high carrier density is located adjacent to the drift region 26. Therefore, the conductivity modulation in the drift region 26 is promoted and an on-resistance of the IGBT is reduced. As such, the third barrier layer 28c of the barrier region 28 can contribute not only to the improvement of recovery property in the diode, but also to the improvement of on-resistance in the IGBT.

A semiconductor device 110 of a second embodiment will be described with reference to FIG. 5. Compared to the semiconductor device 10 of the first embodiment, the configuration of the barrier region 28 is modified in the semiconductor device 110 of the present embodiment. Since the other configurations are common to the first embodiment and the second embodiment, they are denoted with the common reference signs and overlap descriptions thereof may be omitted.

Figure 5:
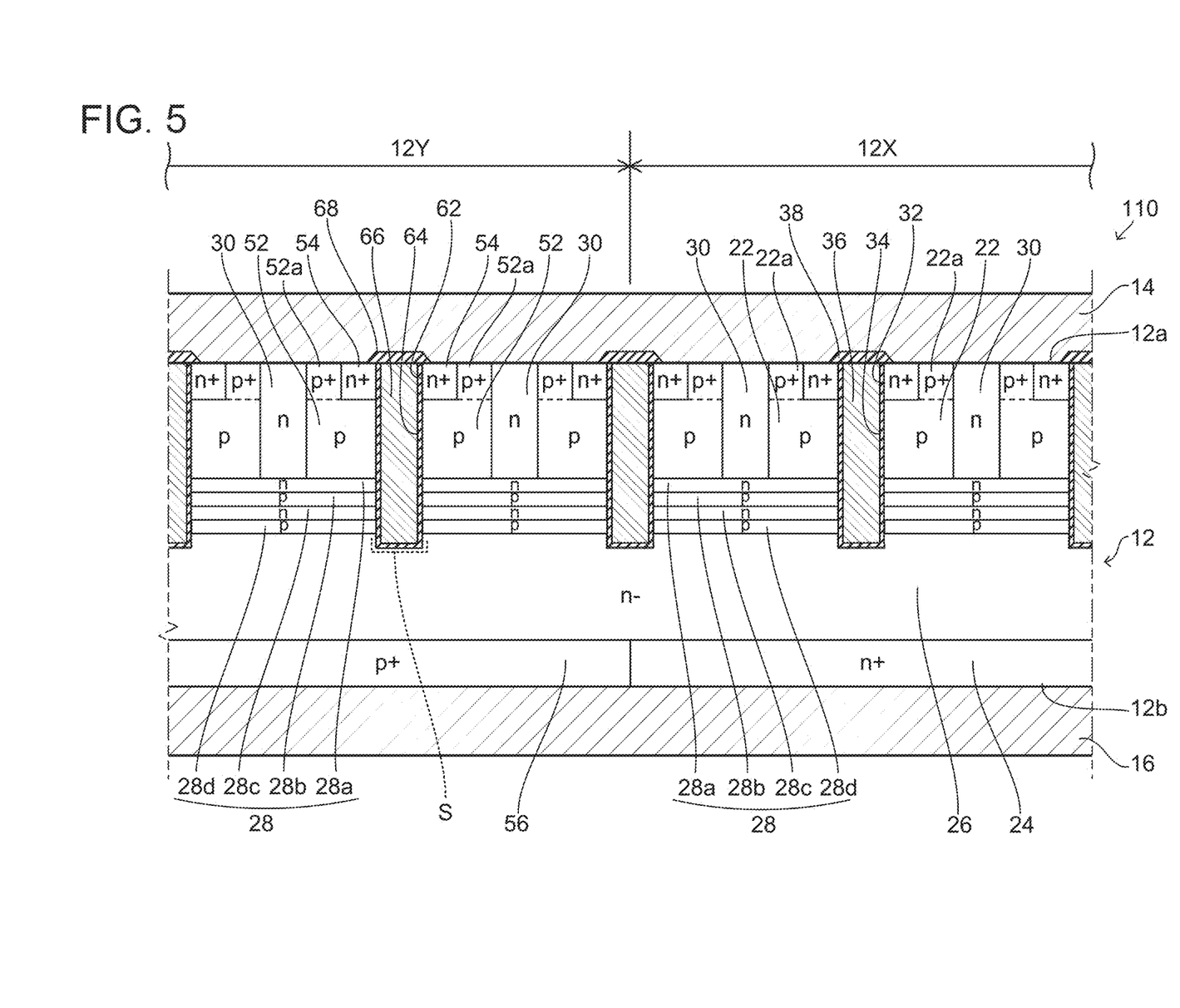
FIG. 5 is a cross sectional view schematically showing a configuration of a semiconductor device 110 of a second embodiment.

As shown in FIG. 5, the barrier region 28 of the present application further comprises a fourth barrier layer 28d, in addition to the first barrier layer 28a, the second barrier layer 28b, and the third barrier layer 28c. The fourth barrier layer 28d is a p-type semiconductor region and is located between the third barrier layer 28c and the drift region 26. A carrier density of the fourth barrier layer 28d may be lower than the carrier density of the collector region 56, and may be substantially equal to or lower than the carrier density of the body region 52. The carrier density of the fourth barrier layer 28d may be equal to the carrier density of the second barrier layer 28b, or may be different therefrom.

When the barrier region 28 comprises the fourth barrier layer 28d, an area S where each gate electrode 66 is opposed to the drift region 26 via its corresponding gate insulator film 64 can be reduced. Due to this, parasitic capacitance between the gate electrodes 66 and the lower electrode 16 is reduced, and thus the IGBT can be turned off (i.e., the gate electrodes 66 can discharge) in a short period of time.

Figure 6:
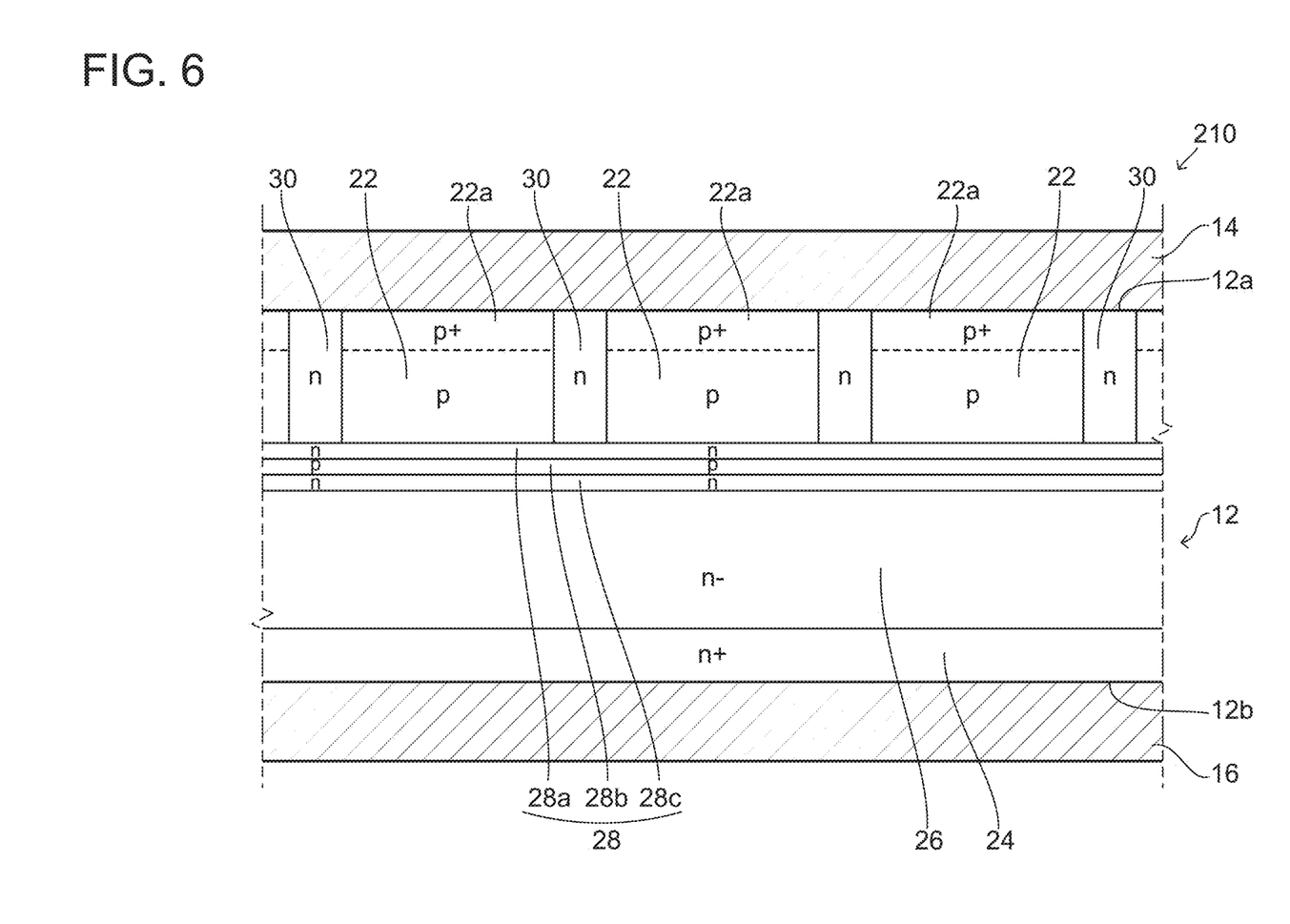
FIG. 6 is a cross sectional view schematically showing a configuration of a semiconductor device 210 of a third embodiment.

A semiconductor device 210 of a third embodiment will be described with reference to FIG. 6. The semiconductor device 210 of the present embodiment does not include an IGBT structure, and includes only a diode structure. Among configurations of the semiconductor device 210 of the present embodiment, ones common to those of the semiconductor devices 10, 110 of the first and second embodiments are denoted with the common reference signs and overlap descriptions thereof may be omitted.

The semiconductor device 210 comprises the semiconductor substrate 12, the upper electrode 14 provided on the upper surface 12a of the semiconductor substrate 12, and the lower electrode 16 provided on the lower surface 12b of the semiconductor substrate 12. The semiconductor substrate 12 comprises the p-type anode region 22 being in contact with the upper electrode 14 and the n-type cathode region 24 being in contact with the lower electrode 16. The portions 22a of the anode region 22 which are in contact with the upper electrode 14 have a higher carrier density than other portion of the anode region 22, and are in ohmic contact with the upper electrode 14. The cathode region 24 has a sufficiently high carrier density and is in ohmic contact with the lower electrode 16.

The semiconductor substrate 12 further comprises the n-type drift region 26 which has a lower carrier density than the cathode region 24 and is interposed between the anode region 22 and the cathode region 24, the barrier region 28 interposed between the anode region 22 and the drift region 26, and the n-type pillar regions 30 which are in Schottky contact with the upper electrode 14 and extend between the barrier region 28 and the upper electrode 14.

The barrier region 28 comprises the n-type first barrier layer 28a, the p-type second barrier layer 28b, and the n-type third barrier layer 28c, and includes the multi-layer structure in which the second barrier layer 28b is interposed between the first barrier layer 28a and the third barrier layer 28c. The carrier densities of the first barrier layer 28a and the third barrier layer 28c are each higher than the carrier density of the drift region 26. The first barrier layer 28a is in contact with the anode region 22 and is connected to the upper electrode 14 via the pillar regions 30.

The semiconductor device 210 of the present embodiment includes the configuration similar to that of the diode region 12X in the semiconductor device 10 of the first embodiment, and can function same as the diode region 12X. It should be noted that the semiconductor device 210 of the present embodiment does not include the trenches 32, the trench insulating films 34, the dummy electrodes 36, or the interlayer insulating films 38. In this regard, the semiconductor device 210 of the present embodiment is different from the diode region 12X of the first embodiment. However, in the semiconductor device 210 of the present embodiment as well, the recovery current is reduced and the snapback phenomenon is suppressed from occurring by the barrier region 28 including the multi-layer structure.

What is claimed is:

1. A semiconductor device comprising:
a semiconductor substrate;
an upper electrode provided on an upper surface of the semiconductor substrate; and
a lower electrode provided on a lower surface of the semiconductor substrate located opposite to the upper surface,
wherein the semiconductor substrate comprises:
a p-type anode region being in contact with the upper electrode;
an n-type cathode region being in contact with the lower electrode;
an n-type drift region interposed between the anode region and the cathode region, a carrier density of the drift region being lower than a carrier density of the cathode region,
a barrier region interposed between the anode region and the drift region; and
an n-type pillar region extending between the barrier region and the upper electrode, the pillar region being in Schottky contact with the upper electrode,
the barrier region comprises a multi-layer structure comprising an n-type first barrier layer, a p-type second barrier layer and an n-type third barrier layer, wherein the second barrier layer is interposed between the first barrier layer and the third barrier layer,
carrier densities of the first and third barrier layers are each higher than the carrier density of the drift region, and
the first barrier layer is in contact with the anode region and is connected to the upper electrode via the pillar region.

2. The semiconductor device according to claim 1, wherein the semiconductor substrate further comprises:
a p-type body region being in contact with the upper electrode;
an n-type emitter region being in contact with the upper electrode and being separated from the drift region by the body region;
a trench provided in the upper surface and extending up to the drift region; and
a p-type collector region being in contact with the lower electrode and being separated from the body region by the drift region,
a gate electrode and a gate insulator film are provided within the trench, the gate electrode being opposed to the emitter region, the body region and the drift region via the gate insulator film, and
the barrier region is interposed between the body region and the drift region.

3. The semiconductor device according to claim 2, wherein the barrier region further comprises a p-type forth barrier layer interposed between the third barrier layer and the drift region.

4. The semiconductor device according to claim 1, wherein the carrier density of the third barrier layer is higher than the carrier density of the first barrier layer.

5. The semiconductor device according to claim 4, wherein the carrier density of the third barrier layer is at least three times as high as the carrier density of the first barrier layer.

6. The semiconductor device according to claim 1, wherein the carrier density of the third barrier layer is constant along a direction parallel with the semiconductor substrate.

* * * * *